(12) United States Patent
Blodgett et al.

(10) Patent No.: US 7,936,181 B2
(45) Date of Patent: *May 3, 2011

(54) METHOD AND CIRCUIT FOR OFF CHIP DRIVER CONTROL, AND MEMORY DEVICE USING SAME

(75) Inventors: Greg A. Blodgett, Nampa, ID (US); Christopher K. Morzano, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/329,132

(22) Filed: Dec. 5, 2008

(65) Prior Publication Data

US 2009/0091350 A1 Apr. 9, 2009

Related U.S. Application Data

(63) Continuation of application No. 11/351,047, filed on Feb. 8, 2006, now Pat. No. 7,463,052, which is a continuation of application No. 10/726,312, filed on Dec. 1, 2003, now Pat. No. 7,019,553.

(51) Int. Cl.
*H03K 19/003* (2006.01)
(52) U.S. Cl. .......................... 326/30; 326/83
(58) Field of Classification Search .............. 326/30, 326/82–83; 327/108, 109
See application file for complete search history.

(56) References Cited

U.S. PATENT DOCUMENTS

| 5,097,149 A | 3/1992 | Lee .......................... 307/443 |
| 5,099,148 A | 3/1992 | McClure et al. .............. 307/443 |
| 5,128,560 A | 7/1992 | Chern et al. ................ 307/475 |
| 5,134,311 A | 7/1992 | Biber et al. .................. 307/270 |
| 5,274,276 A | 12/1993 | Casper et al. ................ 307/443 |
| 5,357,156 A | 10/1994 | Herrington | |
| 5,576,656 A | 11/1996 | McClure ........................ 327/538 |
| 5,594,373 A | 1/1997 | McClure ........................ 327/108 |
| 5,606,275 A | 2/1997 | Farhang et al. ............... 327/108 |
| 5,617,064 A | 4/1997 | Gorecki ...................... 333/22 R |

(Continued)

FOREIGN PATENT DOCUMENTS

EP 0978943 A2 2/2000

(Continued)

OTHER PUBLICATIONS

Gabara, Thaddeus J., et al., "Digitally Adjustable Resistors in CMOS for High-Performance Applications," IEEE Journal of Solid-State Circuits, vol. 27, No. 8, Aug. 1992, pp. 1176-1185. cited by other.

(Continued)

*Primary Examiner* — James Cho
(74) *Attorney, Agent, or Firm* — Lerner, David, Littenberg, Krumholz & Mentlik, LLP

(57) ABSTRACT

An off chip driver impedance adjustment circuit includes a storage circuit adapted to receive and store a drive strength adjustment word. A counter circuit is coupled to the storage circuit to receive the drive strength adjustment word and develops a drive strength count responsive to the drive strength adjustment word. A programmable fuse code to preset the counter. An output driver circuit is coupled to the counter circuit to receive the drive strength count and is adapted to receive a data signal. The output driver circuit develops an output signal on an output responsive to the data signal and adjusts a drive strength as a function of the drive strength count.

28 Claims, 10 Drawing Sheets

U.S. PATENT DOCUMENTS

| | | | |
|---|---|---|---|
| 5,729,152 A | 3/1998 | Leung et al. | 326/21 |
| 5,732,027 A | 3/1998 | Arcoleo et al. | 365/189.05 |
| 5,754,480 A | 5/1998 | Sato | 365/189.05 |
| 5,831,467 A | 11/1998 | Leung et al. | |
| 5,834,951 A | 11/1998 | Klein | 327/53 |
| 5,864,506 A | 1/1999 | Arcoleo et al. | 365/189.5 |
| 5,903,504 A | 5/1999 | Chevallier et al. | 365/207 |
| 5,926,031 A | 7/1999 | Wallace et al. | 326/30 |
| 5,949,254 A | 9/1999 | Keeth | 326/87 |
| 5,995,443 A | 11/1999 | Farmwald et al. | 365/233 |
| 6,026,456 A | 2/2000 | Ilkbahar | 710/101 |
| 6,060,907 A | 5/2000 | Vishwanthaiah et al. | 326/87 |
| 6,066,977 A | 5/2000 | Felton et al. | 327/390 |
| 6,069,504 A | 5/2000 | Keeth | 327/108 |
| 6,087,853 A | 7/2000 | Huber et al. | 326/83 |
| 6,166,563 A * | 12/2000 | Volk et al. | 326/87 |
| 6,198,307 B1 | 3/2001 | Garlepp et al. | 326/83 |
| 6,222,388 B1 | 4/2001 | Bridgewater, Jr. | 326/86 |
| 6,236,255 B1 | 5/2001 | Oguri | 327/310 |
| 6,288,563 B1 | 9/2001 | Muljono et al. | 326/27 |
| 6,307,424 B1 | 10/2001 | Lee | 327/530 |
| 6,307,791 B1 | 10/2001 | Otsuka et al. | 365/189.05 |
| 6,323,687 B1 | 11/2001 | Yano | 326/83 |
| 6,326,802 B1 | 12/2001 | Newman et al. | 326/30 |
| 6,330,194 B1 | 12/2001 | Thomann et al. | 365/189.05 |
| 6,339,351 B1 | 1/2002 | Ang et al. | 327/170 |
| 6,351,138 B1 | 2/2002 | Wong | 326/30 |
| 6,351,421 B1 | 2/2002 | Merritt | 365/189.11 |
| 6,356,105 B1 * | 3/2002 | Volk | 326/30 |
| 6,359,465 B1 | 3/2002 | Hui | 326/30 |
| 6,373,276 B1 | 4/2002 | Hui | 326/30 |
| 6,388,495 B1 | 5/2002 | Roy et al. | 327/309 |
| 6,420,913 B1 | 7/2002 | Ang et al. | 327/108 |
| 6,424,169 B1 | 7/2002 | Partow et al. | 326/30 |
| 6,445,245 B1 | 9/2002 | Schultz et al. | 327/541 |
| 6,445,316 B1 | 9/2002 | Hsu et al. | 341/120 |
| 6,456,124 B1 | 9/2002 | Lee et al. | 327/108 |
| 6,459,320 B2 | 10/2002 | Lee | 327/310 |
| 6,466,487 B1 | 10/2002 | Otsuka | 365/189.05 |
| 6,480,798 B2 | 11/2002 | Lee | 702/107 |
| 6,496,037 B1 | 12/2002 | Bertin et al. | 326/82 |
| 6,501,306 B1 | 12/2002 | Kim et al. | 327/112 |
| 6,545,522 B2 | 4/2003 | Mughal et al. | 327/334 |
| 6,549,036 B1 | 4/2003 | Lee | 326/83 |
| 6,552,959 B2 | 4/2003 | Yamauchi et al. | 365/233 |
| 6,563,337 B2 | 5/2003 | Dour | 326/30 |
| 6,643,789 B2 | 11/2003 | Mullarkey | 713/401 |
| 6,657,906 B2 | 12/2003 | Martin | 365/198 |
| 6,700,418 B2 | 3/2004 | Yu et al. | 327/108 |
| 6,711,073 B2 | 3/2004 | Martin | 365/198 |
| 6,885,226 B2 | 4/2005 | Waldrop | 327/112 |
| 6,944,071 B2 | 9/2005 | Martin | 365/198 |
| 6,965,529 B2 | 11/2005 | Zumkehr et al. | 365/189.05 |
| 7,019,553 B2 | 3/2006 | Blodgett et al. | 326/30 |
| 7,084,662 B1 * | 8/2006 | Om et al. | 326/30 |
| 7,106,638 B2 | 9/2006 | Martin | 365/198 |
| 7,148,721 B2 * | 12/2006 | Park | 326/30 |
| 7,187,601 B2 | 3/2007 | Martin | 365/198 |
| 7,215,579 B2 | 5/2007 | Janzen et al. | 365/189.01 |
| 7,280,410 B2 | 10/2007 | Janzen et al. | 365/189.01 |
| 7,382,667 B2 | 6/2008 | Martin | 365/198 |
| 7,463,052 B2 | 12/2008 | Blodgett et al. | |
| 7,715,256 B2 | 5/2010 | Martin | |
| 2004/0017696 A1 | 1/2004 | Allen et al. | 365/189.05 |
| 2004/0141380 A1 | 7/2004 | Kim et al. | 365/189.05 |
| 2005/0094468 A1 | 5/2005 | Martin | |
| 2006/0109723 A1 | 5/2006 | Martin | 365/198 |
| 2006/0125516 A1 | 6/2006 | Blodgett et al. | 326/30 |

FOREIGN PATENT DOCUMENTS

| | | |
|---|---|---|
| WO | 9524089 A2 | 9/1995 |
| WO | 0154273 A2 | 7/2001 |

OTHER PUBLICATIONS

U.S. Appl. No. 10/726,312.
U.S. Appl. No. 11/061,035.
U.S. Appl. No. 11/542,702.

* cited by examiner

METHOD AND CIRCUIT FOR OFF CHIP DRIVER CONTROL, AND MEMORY DEVICE USING SAME

CROSS-REFERENCE TO RELATED APPLICATIONS

This application is a continuation of U.S. patent application Ser. No. 11/351,047, filed Feb. 8, 2006, U.S. Pat. No. 7,463,052, which is a continuation of U.S. patent application Ser. No. 10/726,312, filed Dec. 1, 2003, U.S. Pat. No. 7,019,553. These applications are incorporated by reference herein.

TECHNICAL FIELD

The present invention relates generally to integrated circuits, and more specifically to output drive strength and slew rate control.

BACKGROUND OF THE INVENTION

In synchronous integrated circuits, the integrated circuit is clocked by an external clock signal and performs operations at predetermined times relative the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically must be synchronized to external operations. For example, data words are placed on a data bus of the memory device in synchronism with the external clock signal, and the memory device must latch these data words at the proper times to successfully capture each data word. In the present description, "external" is used to refer to signals and operations outside of the memory device, and "internal" to refer to signals and operations within the memory device. Moreover, although the present description is directed to synchronous memory devices, the principles described herein are equally applicable to other types of synchronous integrated circuits.

In a conventional double-data rate (DDR) synchronous dynamic random access memory (SDRAM), data drivers in the memory device may operate in either a full-drive operating mode or a reduced-drive operating mode, as will now be described in more detail. Although the principles described herein are discussed with reference to a DDR SDRAM, the principles are applicable to any memory device that may include a clock synchronization circuit for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

In a conventional DDR SDRAM, a data driver receives a data signal DQ and outputs the data signal in response to being clocked by an internal clock signal. Ideally, the data driver outputs the DQ signal on a data bus of the DDR SDRAM in synchronism with a data strobe signal. In conventional DDR SDRAMs, however, the data driver may operate in either a full-drive mode or a reduced-drive mode of operation, and the electrical characteristics of the buffer can vary between modes, which affects the delay of the DQ signal relative to the data strobe signal. More specifically, in a conventional DDR SDRAM an extended load mode register includes an output drive strength bit that determines whether the data drivers operate in the full-drive or reduced-drive mode of operation. A memory controller typically sets the output drive strength bit in the extended load mode register via a load mode register command to thereby place the data driver in the desired operating mode. The data driver is typically placed in the full-drive mode when the DDR SDRAM is being utilized in a conventional application, such as on a conventional memory module, while the data driver may be placed in the reduced-drive mode when the DDR SDRAM is being utilized in a point-to-point application such as on a graphics card, as will be appreciated by those skilled in the art. During the full-drive mode, the data driver provides sufficient current to drive the DQ signals to full-range voltages for a particular loading of the data bus, while during the reduced-drive mode the driver provides a reduced current to drive the DQ signals to reduced voltages given the same loading of the data bus, as will also be appreciated by those skilled in the art.

A conventional memory device may not satisfy a required access time or other specified parameter in both the full- and reduced-drive modes of operation. As a result, some memory devices, such as DDR II devices currently being developed, will execute an off chip driver (OCD) impedance adjustment procedure in which a memory controller applies an OCD adjustment command to a memory device and thereafter provides data on the DQ bus to adjust the impedance or "drive strength" of the output drivers. The process is referred to as "impedance" adjustment because it is the impedance characteristics of the driver that are being controlled, and the impedance characteristics determine the drive current or drive strength with which the drivers drive the DQ bus, as will be appreciated by those skilled in the art. Thus, when referring to drive strength below this may be viewed as controlling the impedance of a driver or controlling the current supplied by the driver, with each being dependent upon the other. While the current DDR II specification provides various parameters for this overall process, many specifics are not set forth, such as circuitry for performing the desired adjustment.

There is a need for a circuit and method for OCD impedance adjustment in DDR II memory devices and any other integrated circuit utilizing output drivers that may operate in two or more drive modes.

DETAILED DESCRIPTION OF THE INVENTION

Figure 1:
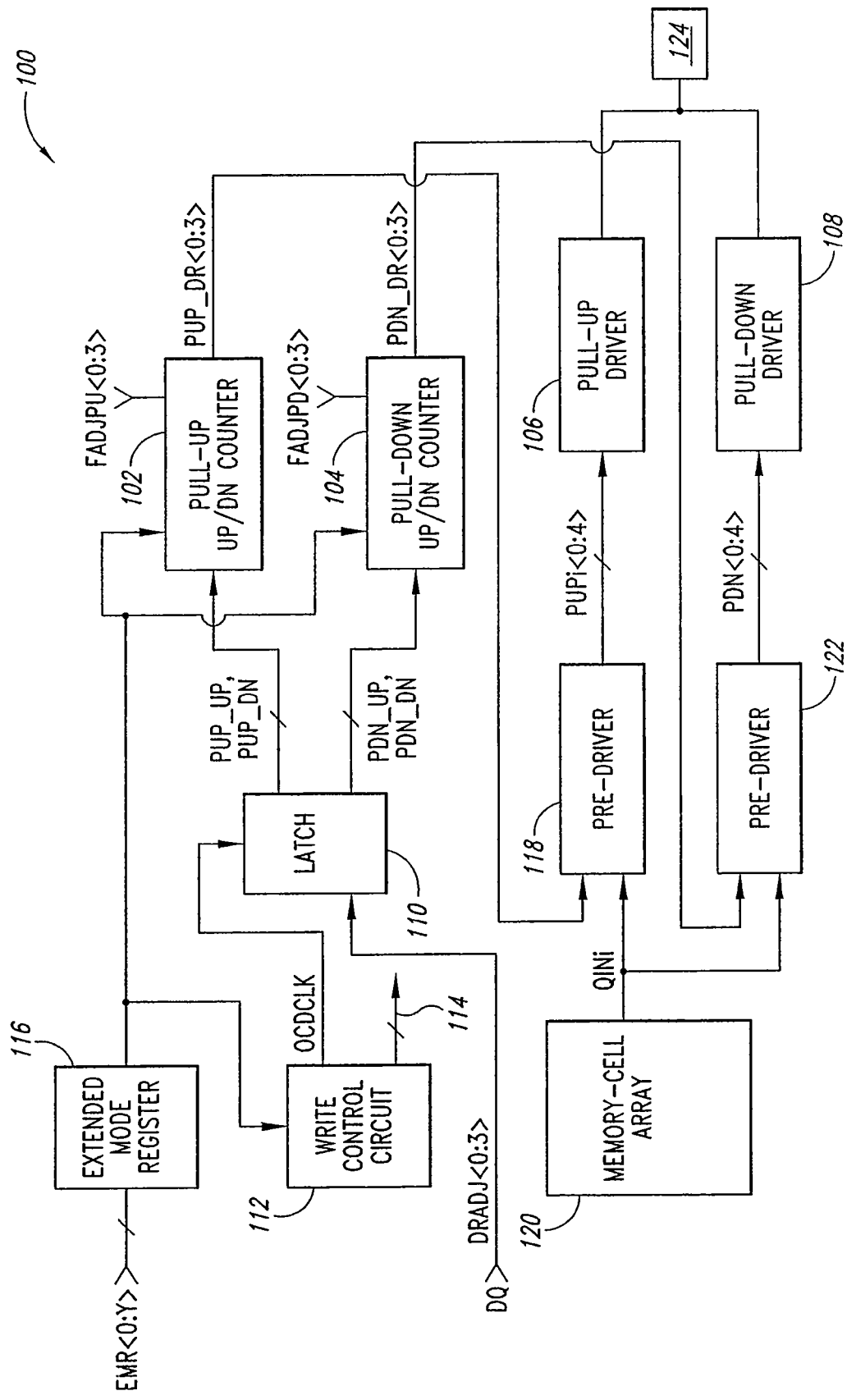
FIG. 1 is a functional block diagram of an off chip driver impedance adjustment circuit according to one embodiment of the present invention.

FIG. 1 is a functional block diagram of an off chip driver (OCD) impedance adjustment circuit 100 according to one embodiment of the present invention. In operation, an external circuit (not shown) such as a memory controller applies a drive strength adjustment word DRADJ<0:3> to the adjustment circuit 100, and in response to the applied DRADJ<0:3> word a pair of up/down (UP/DN) counters 102 and 104 develop respective drive strength words to thereby adjust the output drive strength of a pair of output drivers 106 and 108, as will be discussed in more detail below. In the following description, certain details are set forth to provide a sufficient understanding of the invention. It will be clear to one skilled in the art, however, that the invention may be practiced without these particular details. In other instances, well-known circuits, control signals, timing protocols, and software operations have not been shown in detail or omitted entirely in order to avoid unnecessarily obscuring the invention.

In the impedance adjustment circuit 100, a latch 110 latches the drive strength adjustment word DRADJ<0:3> applied on a data bus DQ responsive to an OCD clock signal OCDCLK from a write control circuit 112. The write control circuit 112 develops a number of control signals 114 that are applied to control various components in the adjustment circuit 100, as will be described in more detail below. The DRADJ<0:3> word is a four-bit word in the example of FIG. 1, and the latch 110 outputs two of the latched adjustment bits as pull-up bits PUP-UP and PUP-DN and outputs the other two of the latched adjustment bits as pull-down bits PDN-UP and PDN-DN.

The pull-up bits PUP-UP, PUP-DN are applied to the pull-up UP/DN counter 102, which increments or decrements a pull-up drive strength count PUP-DR<0:3> responsive to the applied adjustment bits. Similarly, the pull-down bits PDN-UP, PDN-DN are applied to the pull-down UP/DN counter 104, which increments or decrements a pull-down drive strength word PDN-DR<0:3> responsive to the applied adjustment bits. The pull-up UP/DN counter 102 operates in either an adjustment or default mode of operation as determined by the control signals 114 from the write control circuit 112. In the adjustment mode, each counter 102, 104 operates as previously described to increment or decrement the pull-up and pull-down counts PUP-DR<0:3>, PDN-DR<0:3>, while in the default mode the counters utilize a corresponding pull-up fuse adjustment word FADJ-PU<0:3> or pull-down fuse adjustment word FADJ-PD<0:3> to generate the corresponding drive strength count PUP-DR<0:3>, PDN-DR<0:3>.

An extended mode register 116 stores several bits associated with the drive strength adjustment process, including a half drive strength bit HDRV which, when set, causes the drive strength of the drivers 106, 108 to be set to half the default value defined by the FADJ-PU<0:3>, FADJ-PD<0:3> words. Other bits in the extended mode register 116 determine whether the write control circuit 112 controls the components in the circuit 100 to adjust the drive strength of the drivers 106, 108 or utilize the default drive determined by the FADJ-PU<0:3>, FADJ-PD<0:3> words, as will be discussed in more detail below. The extended mode register 116 is a standard component in SDRAMs, with the memory controller loading bits into the register to define various operating parameters of the SDRAM. For example, in addition to the full or half drive strength as previously mentioned, bits in the extended mode register 116 control the enabling or disabling of data strobes provided by the SDRAM, and the enabling or disabling of a delay-locked loop synchronization circuit (not shown) in the SDRAM, as well as determining other operational parameters of the SDRAM as will be understood by those skilled in the art.

A predriver 118 receives the PUP-DR<0:3> count from the counter 102 and also receives a data signal designated QINi from a memory-cell array 120. In response to the PUP-DR<0:3> count and the QINi signal, the predriver 118 develops a pull-up drive strength word PUPi<0:4> that is applied to the output driver 106. One bit of the five bit PUPi<0:4> word is determined by the logic state of the QINi signal, while the other four bits each have values determined by the QINi signal and the applied PUP-DR<0:3> word, and function to set the drive strength of the output driver 106. A predriver 122 receives the PDN-DR<0:3> word from the counter 104 and also receives the QINi signal, and operates in the same way as the predriver 118 to generate a pull-down drive strength word PDN<0:4> that is applied to the output driver 108. Thus, for each PUPi<0:4>, PDN<0:4> word, one of the five bits corresponds to the QINi signal while the other four bits set the drive strength of the corresponding output driver 106, 108. The drive strength of each driver 106, 108 may be set to one of sixteen values in the embodiment of FIG. 1, with the specific value being determined by the four bits in the corresponding PUPi<0:4>, PDN<0:4> word. Each predriver 118, 122 also provides for slew rate compensation to precisely control when the signals forming the PUPi<0:4>, PDN<0:4> words are applied to the drivers 106, 108, which in turn controls the precise time at which each driver drives the data line 124 high or low, as will be discussed in more detail below.

One of the output drivers 106, 108 is activated in response to the applied PUPi<0:4>, PDN<0:4> word, and the activated driver 106, 108 applies data a data line 124 of the data bus DQ. Whether each driver 106, 108 is activated to drive the data line 124 depends on the state of the one bit in the PUPi<0:4>, PDN<0:4> words corresponding to the QINi signal. When the QINi signal is low, the pull-up driver 106 is activated to drive the data line 124 high with a drive strength set by the other four bits in the PUPi<0:4> word. Conversely, when the QINi signal is high the pull-down driver 108 is activated to drive the data line 124 low with a drive strength set by the other four bits in the PDN<0:4> word.

The overall operation of the OCD impedance adjustment circuit 100 will now be described in more detail. In operation, the circuit 100 operates in two modes, an adjustment mode and a default mode, as determined by bits in the extended mode register 116. In the default mode, the write control circuit 112 develops the control signals 114 that cause the counters 102, 104 to develop the PUP-DR<0:3>, PDN-DR<0:3> counts using the corresponding default FADJ-PU<0:3>, FADJ-PD<0:3> words. In this mode, the control circuit 112 does not apply the OCDCLK signal to clock the latch. These PUP-DR<0:3>, PDN-DR<0:3> counts may be termed default words, and are applied to the predrivers 118, 122 which, in turn, generate the PUPi<0:4> and PDN<0:4> words using the default values and an applied QINi signal. Each driver 106, 108 thus drives the data line 124 with a default drive strength defined by the PUP-DR<0:3>, PDN- DR<0:3> counts from the counters 102, 104. When the QINi signal is low, the pull-up driver 106 drives the data line 124 high with the default drive strength, while the pull-down driver 108 drives the data line low with the default drive strength when the QINi signal is high. The default drive strength of each driver 106, 108 is one of the 16 possible values. For example, the four bits in each of the PUPi<0:4>, PDN<0:4> that set the drive strength of the corresponding driver 106, 108 could have the values (0111), which would be halfway between a minimum value of (0000) and a maximum value of (1111).

In the adjustment mode, the write control circuit 112 develops the control signals 114 and OCDCLK signal to cause the counters 102, 104 to adjust the values of the PUP-DR<0:3>, PDN-DR<0:3> counts using the DRADJ<0:3> words. More specifically, the memory controller (not shown) loads bits into the extended mode register 116 to place the circuit 100 into the adjustment mode, and also initially develops control signals 114 that cause each counter 102, 104 to set the PUP-DR<0:3>, PDN-DR<0:3> counts to their default values as determined by the corresponding FADJ-PU<0:3>, FADJ-PD<0:3> words. The memory controller thereafter sequentially applies DRADJ<0:3> words on the data bus DQ, and the write control circuit 112 develops the OCDCLK signal to clock each DRADJ<0:3> word into the latch 110.

For each latched DRADJ<0:3> word, the latch 110 outputs the corresponding PUP-UP, PUP-DN and PDN-UP, PDN-DN bits to the counters 102, 104. In response to the applied PUP-UP, PUP-DN bits, the counter 102 either increments or decrements the PUP-DR<0:3> count. Thus, if the default value of the PUP-DR<0:3> count was 0111 and the count is decremented by one, the new value of the count is 0110. The counter 104 operates in the same way responsive to the PDN-UP, PDN-DN bits to increment or decrement the PDN-DR<0:3> count.

At this point, the adjusted PUP-DR<0:3>, PDN-DR<0:3> counts are applied to the predrivers 118, 122 along with the QINi signal from the memory-cell array. In response to the PUP-DR<0:3> count and QINi signal, the predriver 118 develops the PUPi<0:4> word that is applied to the output driver 106, and the predriver 122 develops the PDN<0:4> word in the same manner responsive to the PDN-DR<0:3> count and QINi signal. Depending on the logic state of the QINi signal, one of the drivers 106, 108 is activated and drives the data line 124 high or low. If the QINi signal is high, the driver 108 is activated and drives the data line 124 low, while the driver 106 is activated if the QINi signal is low to thereby drive the data line high. The memory controller captures the data signal placed on the data line 124 responsive to a data strobe signal DQS (not shown) that is output coincident with the data signal, and the captured data signal is utilized in determining a final drive strength of the drivers 106, 108, as will be discussed in more detail below.

The memory controller repeats the process just described for a number of DRADJ<0:3> words. For each applied DRADJ<0:3> word, the latch 110 captures the word and outputs the corresponding PUP-UP, PUP-DN, PDN-UP, PDN-DN bits to increment or decrement and the counters 102, 104, and the predrivers 118, 122 and output drivers 106, 108 thereafter operate as previously described to adjust the drive strength of the output drivers and drive the data line 124. Each DRADJ<0:3> word results in the drive strength of each driver 106, 108 either being incremented or decremented from its prior value, or results in the drive strength remaining the same. The memory controller continues operating in this manner to adjust the strength of the drivers 106, 108 to desired values. The specific process utilized by the controller in determining a final value for the drive strength is not relevant to the present invention and may vary, and thus, for the sake of brevity, such a process will not be described in more detail. The OCD impedance adjustment circuit 100 allows the controller to easily adjust the drive strengths of the drivers 106, 108 to such desired values. Note that the extended mode register 116 and memory-cell array 120 are shown in FIG. 1 for convenience in describing the operation of the OCD impedance adjustment circuit 100, and need not be considered components of the impedance adjustment circuit.

Figure 2:
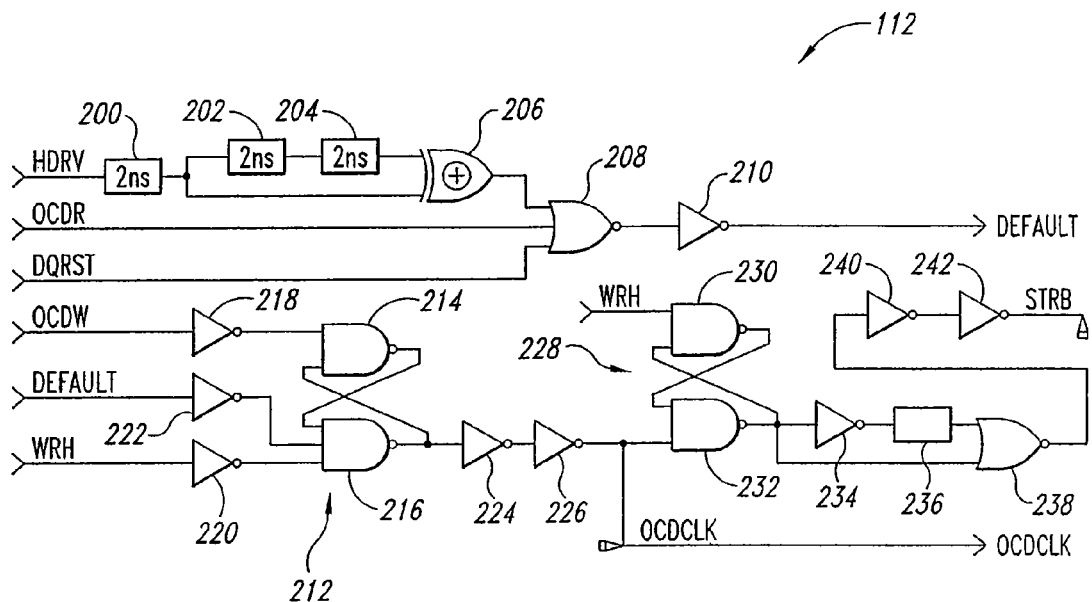
FIG. 2 is a schematic of the write control circuit of FIG. 1 according to one embodiment of the present invention.

FIG. 2 is a schematic of the write control circuit 112 of FIG. 1 according to one embodiment of the present invention. The write control circuit 112 receives a power-up reset signal DQRST from circuitry (not shown) which is activated upon power-up of a memory device containing the write control circuit 112. The DQRST signal has a high logic level during power up, but is typically at a low logic level otherwise. The active DQRST signal applied to a NOR gate 208 causes a default signal DEFAULT output by an inverter 210 to become active high, which in turn forces the OCDCLK signal high as well. A default drive signal OCDR has a logic level responsive to corresponding bits loaded in the extended mode register 116, as previously discussed, and is used to force a default drive strength. A half drive signal HDRV is used to set the drive strength of the output drivers 106, 108 to be approximately one half the default drive strengths, and has a logic level responsive to corresponding bits loaded in the extended mode register 116. The HDRV signal is applied through series-connected delay circuits 200-204 as shown to an XOR gate 206 to generate a pulse that sets the counters 102 and 104 to their default values when the HDRV is initially set. In the event that the OCDR and DQRST signals, and the HDRV pulse are all inactive, drive strength adjustments can be made.

More specifically, a reset signal OCDW applied through an inverter 218 to a reset input of a first RS latch 212 formed by cross-coupled NAND gates 214, 216 is pulsed high to prepare the write control circuit 112 for a data write operation in order to load an OCD adjustment control word. The DEFAULT signal is also applied to the NAND gate 216 through an inverter 222. As a result of the OCDW pulse, the OCDCLK signal is forced to a low logic level. A subsequent write command will now cause a set signal WRH, which is applied through an inverter 220 to a set input of the latch 212 and also to a reset input of a second RS latch 228 formed by cross-coupled NAND gates 230 and 232, to pulse high when the OCD adjustment control word is valid. Upon the rising edge of the WRH pulse, the OCDCLK signal is forced back to a high logic level via the inverters 224, 226 to latch the OCD adjustment control word. While the WRH pulse is high, a strobe pulse STRB remains in a low logic state. However, when the WRH pulse goes low, an active STRB pulse is output in response to the output of the NAND gate 232 being applied to an inverter 234, delay circuit 236, NOR gate 238, and inverters 240, 242, after the OCD adjustment word has been latched. As will be explained in more detail below, the DEFAULT and STRB signals are applied to control other components in the adjustment circuit 100. For example, the active STRB pulse forces the counters 102, 104 to respond to the latched drive adjustment word.

Figure 3:
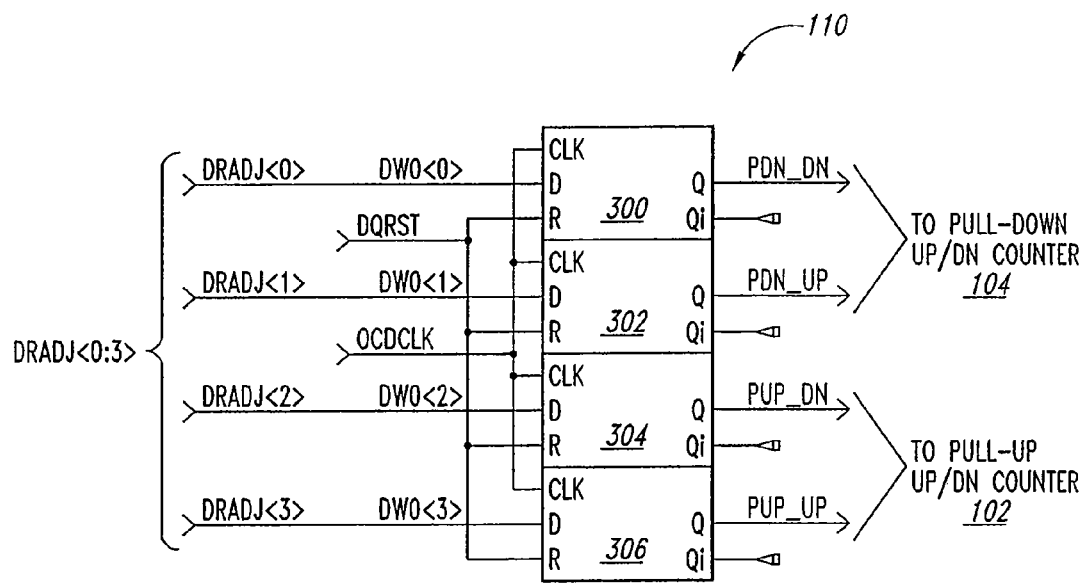
FIG. 3 is a schematic of the latch of FIG. 1 according to one embodiment of the present invention.

FIG. 3 is a schematic of the latch 110 of FIG. 1 according to one embodiment of the present invention. The latch 110 includes four flip-flops 300-306 that receive respective bits of the DRADJ<0:3> word and latch these respective bits responsive to the OCDCLK signal. The flip-flops 300-306 are reset responsive to the DQRST signal, with each flip-flop driving a corresponding output inactive low responsive to the DQRST signal going active. The latched DRADJ<0>-DRADJ<1> bits are output from the flip-flops 300 and 302 as the PDN-DN and PDN-UP bits, respectively, and are applied to the pull-down UP/DN counter 104 (FIG. 1). Similarly, the latched DRADJ<2>-DRADJ<3> bits are output from the flip flops 304 and 306 as the PUP-DN and PUP-UP bits, respectively, and are applied to the pull-up UP/DN counter 102 (FIG. 1).

Figure 4:
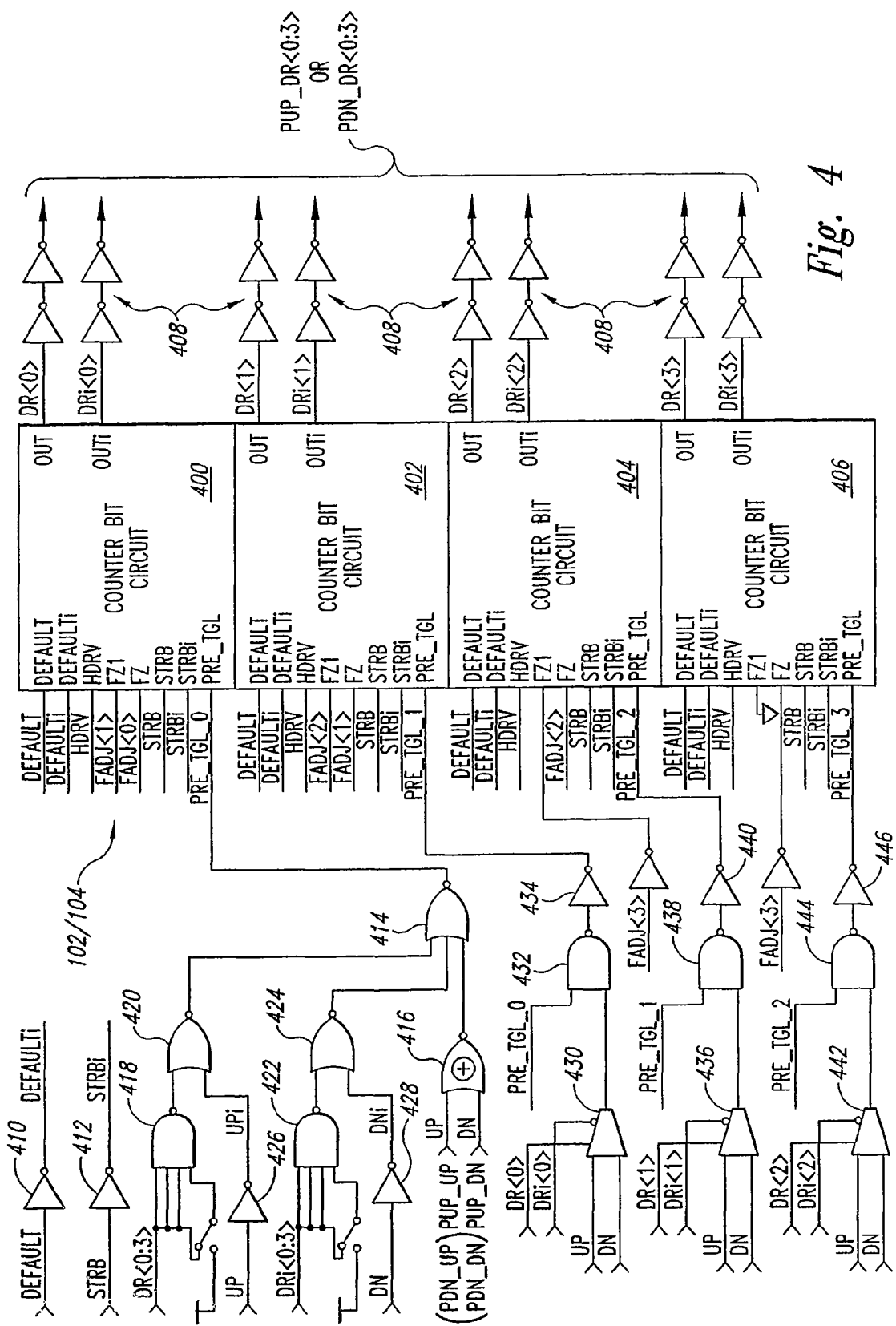
FIG. 4 is a schematic of each of the counters of FIG. 1 according to one embodiment of the present invention.

FIG. 4 is a schematic of each of the counters 102, 104 of FIG. 1 according to one embodiment of the present invention. In the following description, the counter in FIG. 4 will be referred to as the pull-up UP/DN counter 102 for ease of description. The counter 102 includes four counter bit circuits 400-406, with each counter bit circuit having respective complementary outputs DR<0>, DRi<0>-DR<3>, DRi<3> that are applied through series-connected inverters 408 to generate a corresponding bits of the PUP-DR<0:3> count.

The DEFAULT and STRB signals generated by the write control circuit 112 of FIG. 2 are applied through respective inverters 410, 412 to generate complementary signals DEFAULTi and STRBi that are applied to each of the counter bit circuits 400-406. When the complementary DEFAULT signals are active, each counter bit circuit 400-406 operates in the default mode and one of the bits FADJ<0>-FADJ<3> is provided as the corresponding DR<0:3>, DRi <0:3> outputs, with the specific output provided depending upon the state of the HDRV signal. The FADJ<0>-FADJ<3> bits in FIG. 4 correspond to the FADJ-PU<0>-FADJ-PU<3> bits shown in FIG. 1. An example of the operation of the counter bit circuits 400-406 in the default mode will now be described in more detail for the counter bit circuit 400. When the HDRV signal is inactive, the counter bit circuit 400 latches the FADJ<0> bit responsive to the STRB signals and outputs the latched bit as the DR<0>, DRi<0> bits. When the HDRV signal is active, the counter bit circuit 400 latches the FADJ<1> bit responsive to the STRB signals and outputs this latched bit as the DR<0>, DRi<0> bits. This results in the bits of the FADJ<0: 3> word being shifted to the right one place when the HDRV signal is active, which divides the value of the FADJ<0:3> word by two.

When the DEFAULT signals are inactive, each counter bit circuit 400-406 operates in the adjustment mode and either toggles or leaves the same the corresponding DR, DRi bits responsive to a toggle signal PRE-TGL0-3 applied to each of the counter bit circuits. A NOR gate generates the PRE-TGL-0 signal applied to circuit 400 responsive to three input signals. An XOR gate 416 receives the PUP-UP, PUP-DN bits and applies an active input to the NOR gate 414, and otherwise provides an inactive input to the NOR gate. A NAND gate 418 and NOR gate 420 operate in combination as a full-up count detection circuit, with the NOR gate 420 applying a high input to the NOR gate 414 when the PUP-DR<0:3> count has its maximum value of (1111). Similarly, a NAND gate 422 and NOR gate 424 operate in combination as a full-down count detection circuit, with the NOR gate 424 applying a high input to the NOR gate 414 when the PUP-DR<0:3> count has its minimum value of (0000). The PUP-UP signal is applied through an inverter 426 to enable the NOR gate 420 when this signal is high and the PUP-DN signal is applied through an inverter 428 to enable the NOR gate 424 when this signal is high. In this way, the NOR gate 420 is enabled when the PUP-DR<0:3> count is being incremented to determine whether the count has reached its maximum value, and the NOR gate 424 is enabled when the PUP-DR<0:3> count is being decremented to determine whether the count has reached its minimum value.

When any of the outputs of the NOR gates 420, 424, or XOR gate 416 goes inactive high, the NOR gate 414 drives the PRE-TGL-0 signal low, which disables the toggling of the DR<0> bits responsive to the STRB signals. When the PRE-TGL-0 signal is high, meaning the PUP-UP and PUP-DN signals have complementary values and the PUP-DR<0:3> count is not at its maximum or minimum, the counter bit circuit 400 toggles the bit DR<0> responsive to the STRB signals.

A transmission gate 430 receives the PUP-UP, PUP-DN signals and outputs one of the signals responsive to the DR<0>, DRi<0> bit from the counter bit circuit 400, with the output PUP-UP, PUP-DN signal being applied to a NAND gate 432. The PRE-TGL-0 signal is also applied to enable the NAND gate 432, and the output of the NAND gate 432 is applied through an inverter 434 to generate a toggle signal PRE-TGL-1 applied to the counter bit circuit 402. The counter bit circuit 402 operates in the same way as described for the circuit 400 responsive to the PRE-TGL-1 signal and other signals applied to the circuit. Components 436-446 operate in the same way as described for the components 430-434 to generate a PRE-TGL-2 signal applied to the counter bit circuit 404 and a PRE-TGL-3 signal applied to the counter bit circuit 406.

In operation, when the PUP-UP signal is 1 and PUP-DN signal is 0, the counter 102 increments the PUP-DR<0:3> count by one, and when the PUP-UP signal is 0 and PUP-DN signal is 1 the counter decrements this count by one. Note that whenever the PRE-TGL-0 signal is inactive low, meaning that counter bit circuit 400 will not toggle the least significant bit DR<0>, all other counter bit circuit 402-406 will be similarly disabled. The theory of operation of the counter 102 will now be briefly described with reference to FIG. 4, although one skilled in the art will understand such operation merely from the illustrated schematic. In incrementing the PUP-DR<0:3> count, the least significant bit DR<0> alternately toggles between 0 and 1. For a given bit of the PUP-DR<0:3> count, if the next least significant bit is a 0 then the given bit does not toggle. For example, if the current value of the PUP-DR<0:3> count is (1010), the DR<1> bit will not toggle because the DR<0> bit is a 0. Also, for a given bit of the PUP-DR<0:3> count, this bit will only toggle when all lesser significant bits are 1's. For example, the count (1010) will increment to (1011) and the DR<2> did not toggle because the DR<0> and DR<1> lesser significant bits were not both 1's. However, at this point, if incremented, the count increments to 1100, with the DR<2> bit toggling to a 1 because both the DR<0> and DR<1> bits are 1's. Note that in this example the DR<3> bit does not toggle since not all lesser significant bits are 1's. The operation in decrementing the PUP-DR<0:3> count is similar and will be understood by those skilled in the art.

Figure 5:
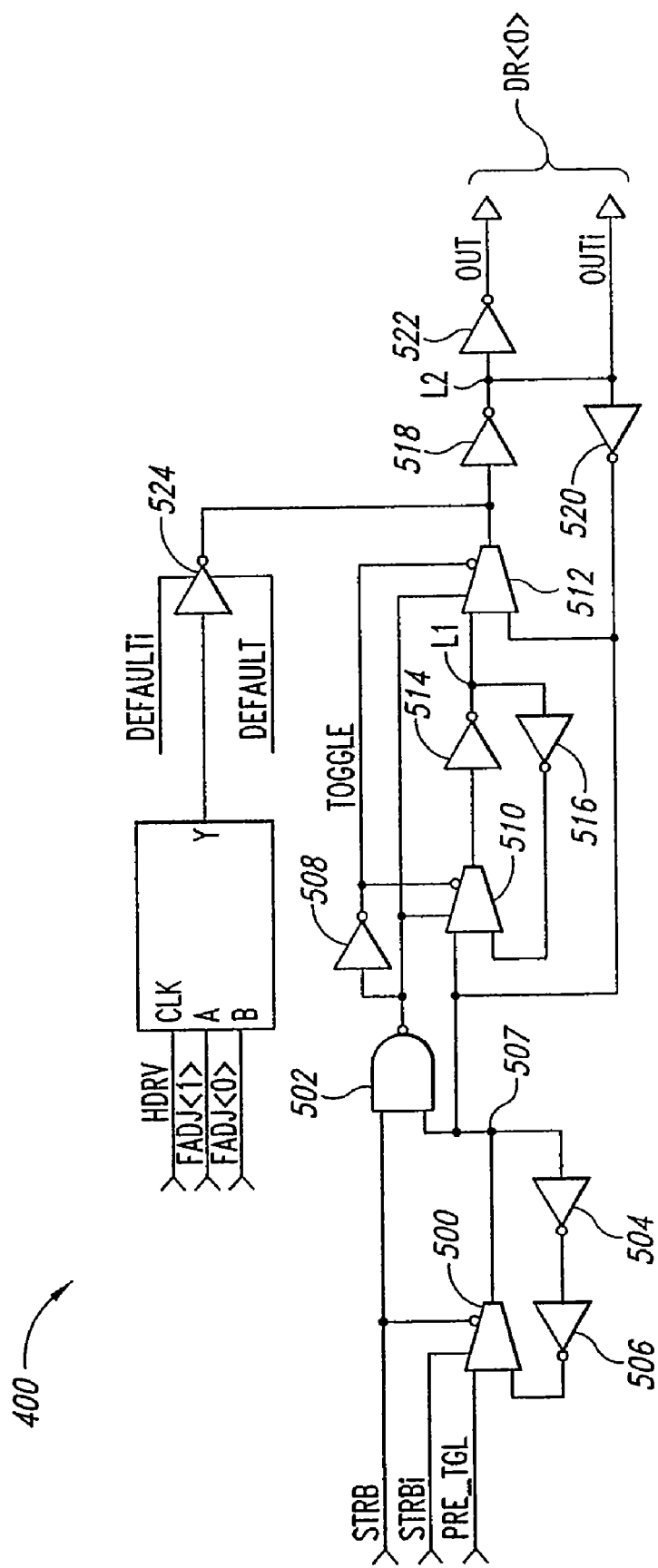
FIG. 5 is a schematic of one of the individual counter bit circuits forming the counter of FIG. 4.

FIG. 5 is a schematic of one of the individual counter bit circuits 400-406 forming the counter 102 of FIG. 4. In the following description, the depicted circuit is assumed to be the counter bit circuit 400. When the complementary STRB signals are inactive, a transmission gate 500 applies the PRE-TGL signal to one input of a NAND gate 502 and also through series connected inverters 504, 506 to a second input of the transmission gate. The transmission gate 500 and inverters 504, 506 operate as a latch to latch the previous value of the PRE-TGL signal and provide this signal on a node 507 when the STRB signals go active. When the PRE-TGL signal is high, the NAND gate 502 is enabled and drives its output low when the STRB signals go active. The output of the NAND gate 502 is applied directly and through an inverter 508 to transmission gates 510, 512. The transmission gate 510 and a pair of inverters 514, 516 operate as a first latch having an output L1, and the transmission gate 512 and a pair of inverters 518, 520 operate as a second latch having an output L2.

The output L2 of the second latch is applied directly and through an inverter 522 to generate DRi<0> and DR<0> bits.

In operation, when the latched PRE-TGL signal on the node 507 is active high to enable the NAND gate 502, the NAND gate drives its output low responsive to the STRB signals going active and drives its output high responsive to the STRB signals going inactive. Assuming that the output L1 is initially low, when the output of the NAND gate 502 is low, the transmission gate 512 is enabled and applies the output L1 to the inverter 518 which, in turn, drives the output L2 high. When the output of the NAND to 502 goes high, the output L2 is applied through the inverter 520 and through the transmission gate 512 to the input of the inverter 518 such that the second latch stores the value of L2, which is the complementary value of L1. Also note that the output L2 is applied through the inverter 520 to an input of the transmission gate 510. When the output of the NAND gate 502 goes high, the transmission gate 510 is enabled and the value of L2 is applied through the inverter 520, through the transmission gate 510, and through the inverter 514 to the output L1 of the first latch. When the output of the NAND to 502 once again goes low, this new value for the output L1, which is same as the current value of L2, will be applied through the inverter to provide the complement of this signal as the new L2 value. In this way, the first and second latches are merely serially-connected latches with the output of the second latch being inverted and fed back to the input of the first latch, as will be appreciated by those skilled in the art. When the DEFAULT signal is high, a gate 524 is enabled to force L2 to a value determined by the HDRV signal and the FADJ <0:1> bits, as previously described. It will be appreciated by those ordinarily skilled in the art that the gate 524 has higher drive than the transmission gate 512 to overwrite the second latch for L2.

Figure 6:
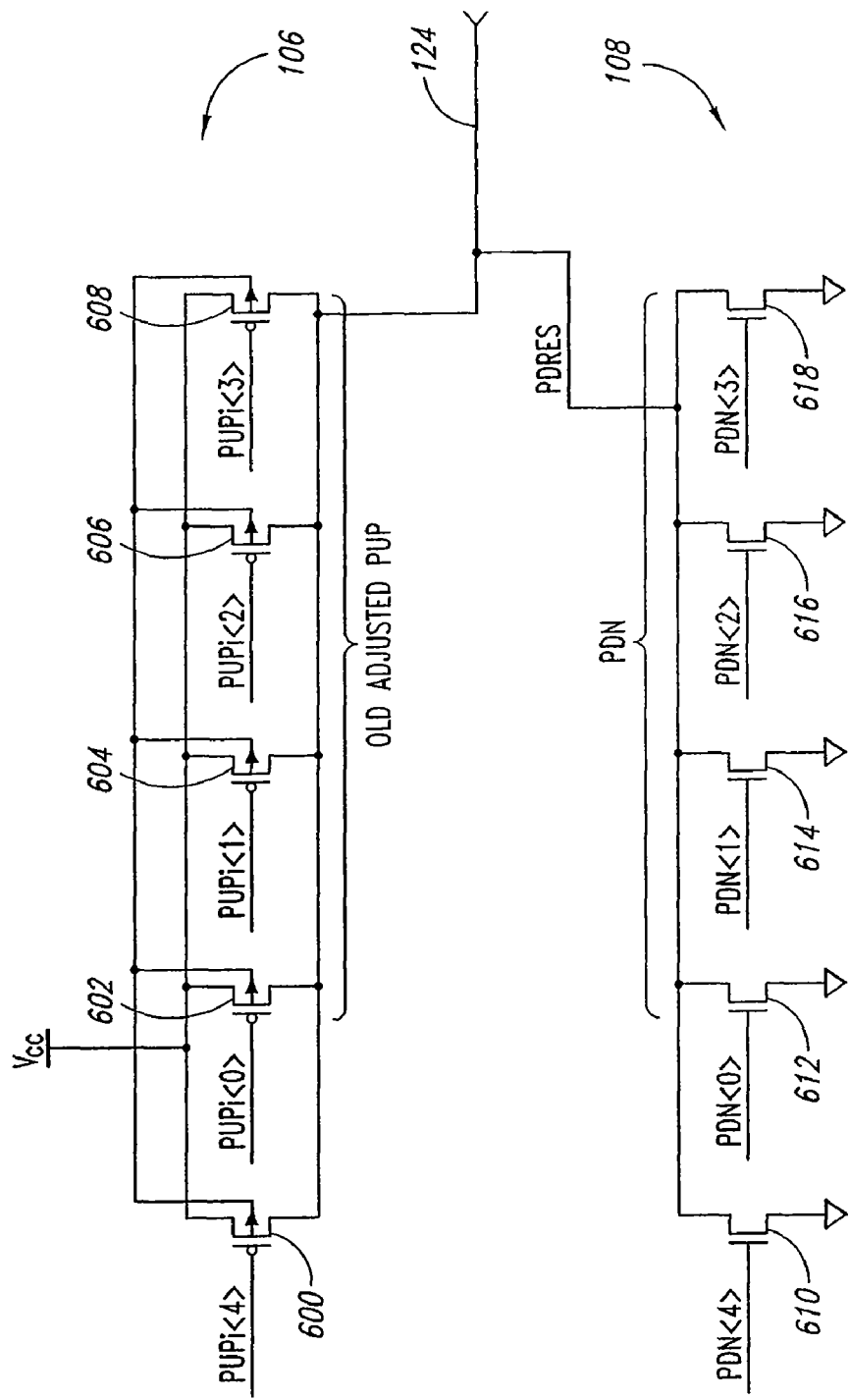
FIG. 6 is a schematic illustrating the output drivers of FIG. 1 according to one embodiment of the present invention.

FIG. 6 is a schematic illustrating one embodiment of the output drivers 106, 108 of FIG. 1. The output driver 106 includes five PMOS transistors 600-608 coupled between a supply voltage VCC and the data line 124, each PMOS transistor receiving a respective bit of the PUPi<0:4> word from the predriver 118 (FIG. 1). When any of the PUPi<0>-<4> bits is low, the corresponding PMOS transistor 600-608 turns on, driving the data line 124 high through that transistor. The drive strength of the driver 106 is determined by the number of transistors 600-608 that are turned on. The PMOS transistor 600 provides the minimum drive strength of the driver 106 in that if the driver is activated to drive the data line 124 high, and the data line will be driven high through at least the PMOS transistor 600.

The output driver 108 includes five NMOS transistors 610-618 coupled between ground and the data line 124, each NMOS transistor receiving a respective bit of the PDN<0:4> word from the predriver 122 (FIG. 1). When any of the PDN<0>-<4> bits is high, the corresponding NMOS transistor 610-618 turns on, driving the data line 124 low through that transistor. The drive strength of the driver 108 is determined by the number of transistors 610-618 that are turned on, and the NMOS transistor 610 provides the minimum drive strength of the driver in that if the driver will drive the data line low through at least the NMOS transistor 610.

Figure 7:
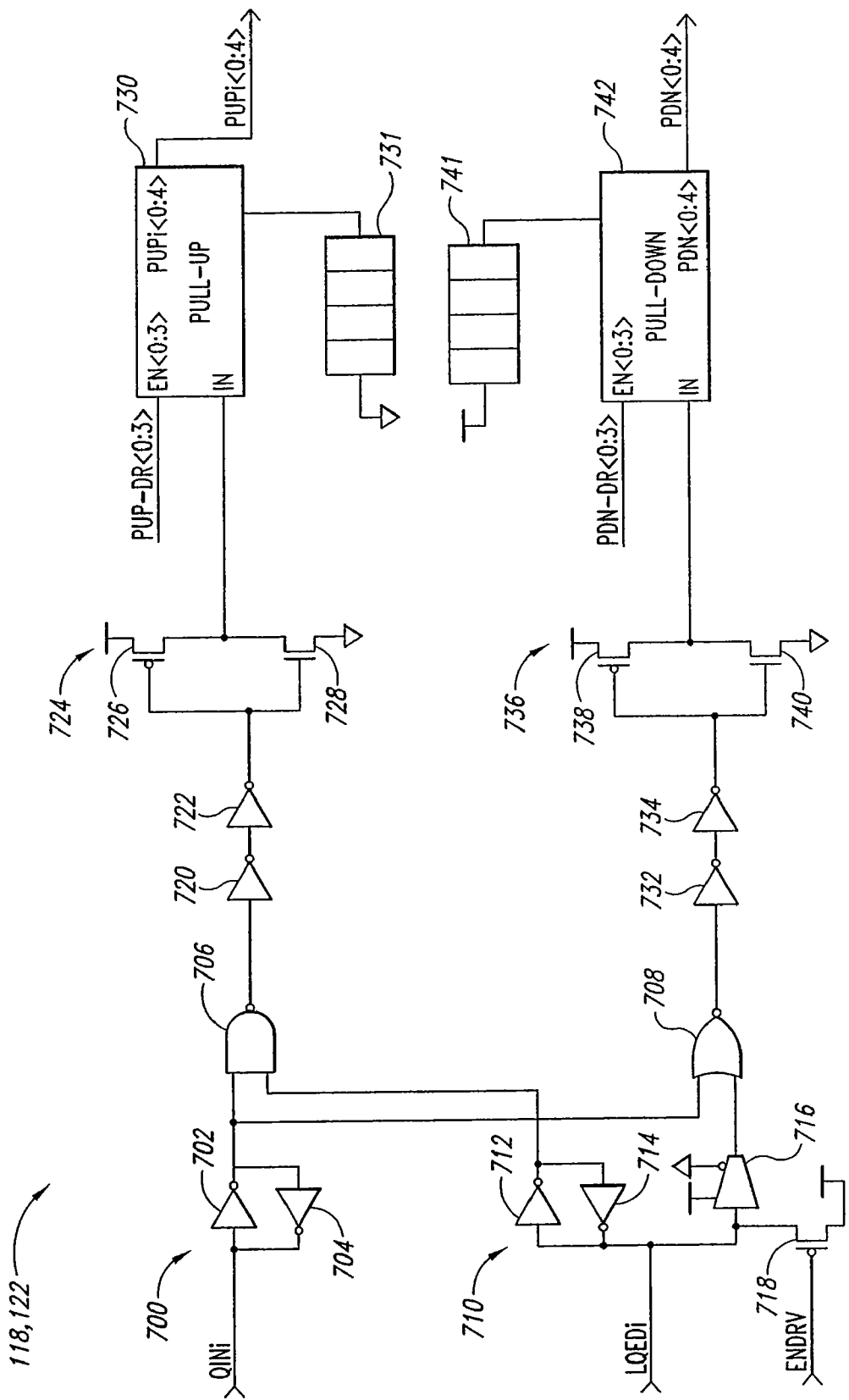
FIG. 7 is a functional schematic of the pre-drivers of FIG. 1 according to one embodiment of the present invention.

FIG. 7 is a functional schematic of the pre-drivers 118, 122 of FIG. 1 according to one embodiment of the present invention. The QINi signal from the memory-cell array 120 (FIG. 1) is stored by a latch 700 formed by cross-coupled inverters 702, 704 and applied to first inputs of a NAND gate 706 and a NOR gate 708. A latch 710 formed by cross-coupled inverters 712, 714 latches an external signal LQEDi. When the LQEDi is active low, the latch 710 applies a high output to enable the NAND gate 706 and is applied through a transmission gate 716 to enable the NOR gate 708. An enable drive signal ENDRV is applied to a PMOS transistor 718, and when activated forces the LQEDi signal high to thereby disable the NAND gate 706 and NOR gate 708.

In operation, when the QINi signal is low, the NAND gate 706 applies an active low output through series-connected inverters 720, 722 to an input of an inverter 724 formed by a PMOS transistor 726 and an NMOS transistor 728. In response to the low output from the inverter 722, the PMOS transistor 726 turns on driving an input of a pull-up circuit 730 high. Conversely, when the QINi signal is high, the NAND gate 706 drives its output high and the inverter 724 drives the input of the pull-up circuit 730 low. The pull-up circuit 730 also receives the PUP-DR<0:3> count from the counter 102 (FIG. 1), and in response to this count and the output of the inverter 724 the pull-up circuit generates the PUPi<0:4> word. A resistor network 731 is coupled to a low terminal of the pull-up circuit 730 and determines a rate at which the circuit drives each of the bits in the PUPi<0:4> word to its desired value, as explained in more detail below.

In response to the low QINi signal, the nor gate 708 also applies a low output through series-connected inverters 732 and 734 to an input of an inverter 736 formed by a PMOS transistor 738 and an NMOS transistor 740. The inverter 736 operates in the same way as the inverter 724 in response to the low input to drive an input of a pull-down circuit 742 high. The pull-down circuit 742 also receives the PDN-DR<0:3> count from the counter 104 (FIG. 1), and in response to this count and the output of the inverter 736, the pull-down circuit 742 generates the PDN<0:4> word. A resistor network 741 is coupled to a high terminal of the pull-down circuit 742 and determines a rate at which the circuit drives each of the bits in the PDN<0:4> word to its desired value, as explained in more detail below.

Figure 8:
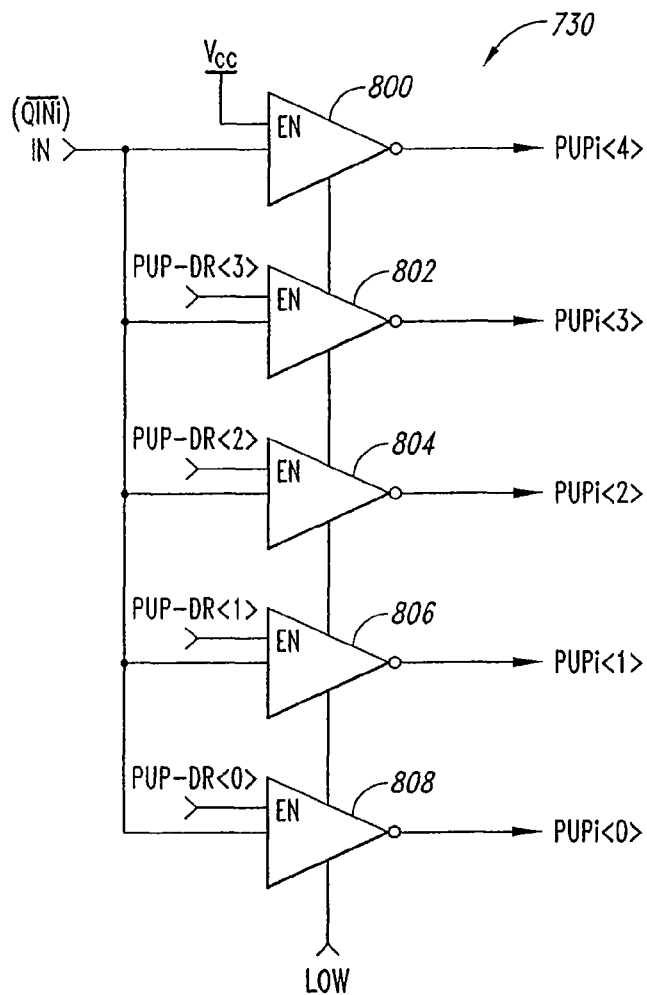
FIG. 8 is a schematic illustrating one embodiment of the pull-up circuit of FIG. 7.

FIG. 8 is a schematic illustrating one embodiment of the pull-up circuit 730 of FIG. 7. The pull-up circuit 730 includes a plurality of inverters 800-808 each receiving an input signal IN corresponding to the output of the inverter 724 in FIG. 7. The value of the input signal IN is the complement of the value of the QINi signal, as indicated in parentheses in FIG. 8. Each inverter 800-808 receives an enable signal which, when active, allows for normal operation of the inverter and when inactive drives the output of the inverter high independent of the input signal IN. The enable signal of the inverter 800 is coupled to a supply voltage VCC to permanently enable the inverter and cause the inverter to provide the complement of the IN signal as the PUPi<4> bit. The enable signals of the inverters 802-808 are supplied by the respective PUP-DR<0>-PUP-DR<3> bits from the counter 102. When a given bit is high (i.e., the logic 1), the corresponding inverter 802-808 is enabled and the inverter drives the corresponding PUPi<0>-PUPi<3> to a level determined by the value of the IN signal. Each inverter 800-808 also includes a LOW terminal that is coupled to the resistor network 731 of FIG. 7.

Figure 9:
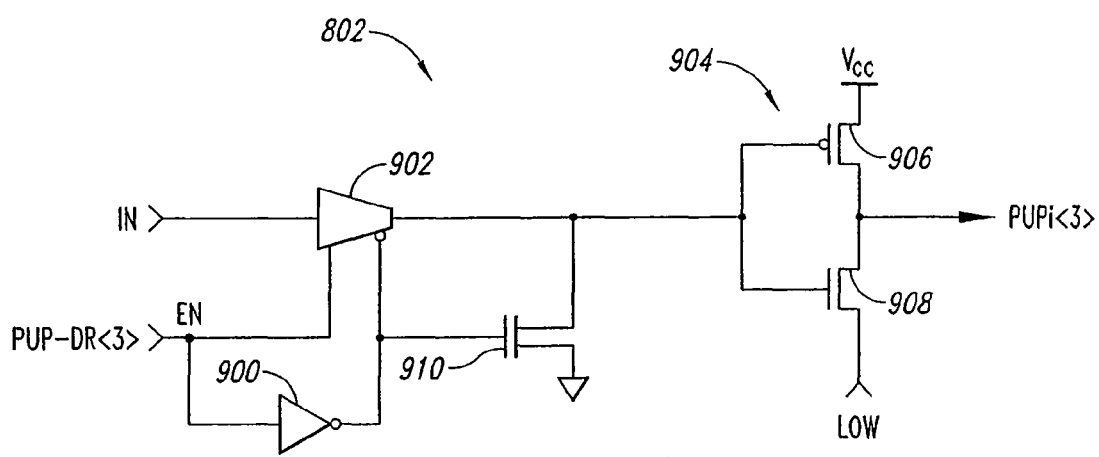
FIG. 9 is a schematic of each of the inverters forming the pull-up circuit of FIG. 7 according to one embodiment of the present invention.

FIG. 9 is a schematic of each of the inverters 800-808 forming the pull-up circuit 730 of FIG. 7 according to one embodiment of the present invention. In the following description, the schematic of FIG. 9 will be described as the inverter 802. The PUP-DR<3> bit corresponds to the enable signal for the inverter 802 and is applied directly and through an inverter 900 to a transmission gate 902. The IN signal is applied through the transmission gate 902 to an input of an inverter 904 formed by a PMOS transistor 906 and an NMOS transistor 908 coupled between a supply voltage VCC and the LOW terminal which, as previously discussed, is coupled to the resistor network 731 of FIG. 7. The output of the inverter 904 corresponds to the PUPi<3> bit applied to the pull-up driver 106 of FIG. 6. The output of the inverter 900 is further applied to an NMOS transistor 910 coupled between the input of the inverter 904 and ground.

In operation, when the PUP-DR<3> bit is active high, the transmission gate 902 is enabled and the IN signal is applied to the input of the inverter 904 which, in turn, generates the PUPi<3> bit having a value that is the complement of the IN signal. The value of the resistor network 731 coupled to the LOW terminal of the inverter 904 determines the rate at which the inverter drives the PUPi<3> bit to its desired value and thus controls the slew rate of the inverter. The NMOS transistor 910 is turned off when the PUP-DR<3> bit is active high. When the PUPi<3> bit is inactive low (i.e., is a logic 0), the transmission gate 902 is disabled and the transistor 910 turns on driving the input of the inverter 904 low which, in turn, drives the PUPi<3> bit high independent of the IN signal.

Figure 10:
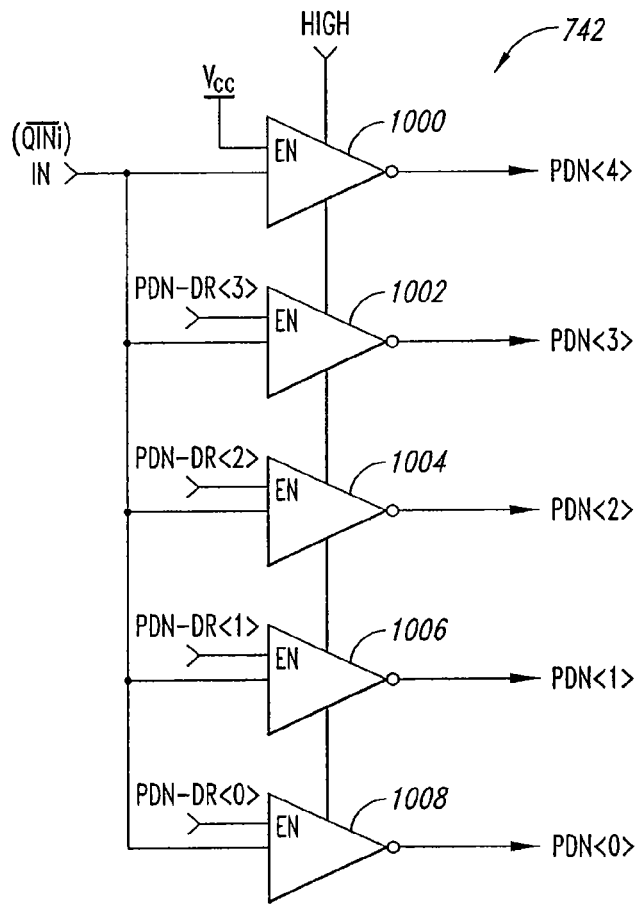
FIG. 10 is a schematic illustrating one embodiment of the pull-down circuit of FIG. 7.

FIG. 10 is a schematic illustrating one embodiment of the pull-down circuit 742 of FIG. 7. The pull-down circuit 742 includes five inverters 1000-1008 coupled in much the same way as the inverters 800-808 previously described with reference to FIG. 8, and thus, the interconnection of these inverters will not again be described in detail. The inverter 1000 is permanently enabled while each of the other inverters 1002-1008 is enabled by a respective PDN-DR signal. That is, when a given bit is high (i.e., the logic 1), and the corresponding inverter 1002-1008 is enabled when the corresponding PDN-DR<3>-PDN-DR<0> bit is a 1, the inverter drives the corresponding PDN<0>-PDN<3> bit to a level determined by the value of the IN signal. Each inverter 1002-1008 also includes a HIGH terminal that is coupled to the resistor network 741 of FIG. 7. When disabled, each of the inverters drives the corresponding PDN<3>-PDN<0> bit low regardless of the signal level of the IN signal applied to its input.

Figure 11:
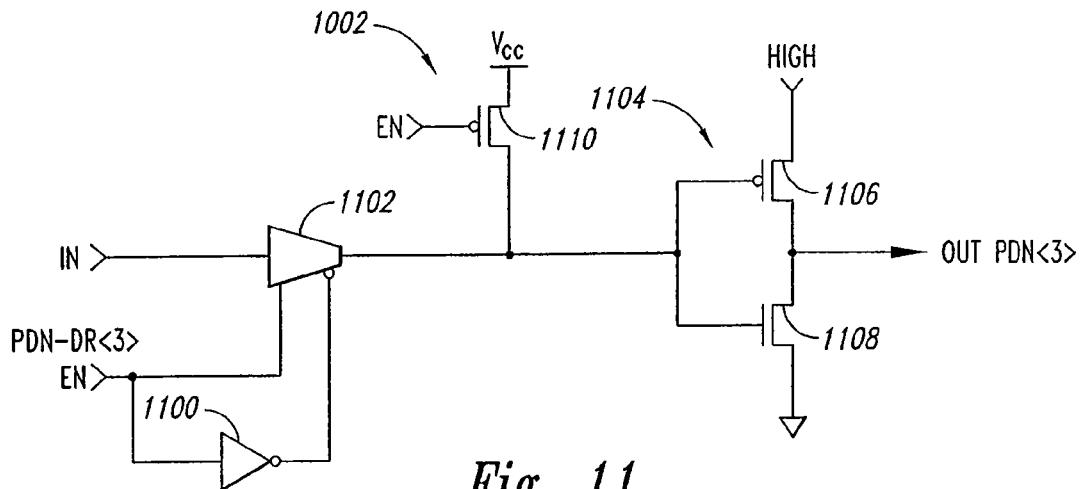
FIG. 11 is a schematic of each of the inverters forming the pull-down circuit of FIG. 10 according to one embodiment of the present invention.

FIG. 11 is a schematic of each of the inverters 1000-1008 forming the pull-down circuit 742 of FIG. 10 according to one embodiment of the present invention. The inverter 1002 is assumed to be illustrated in FIG. 11, and includes components 1100-1108 that function in substantially the same way as components 900-908 in the inverter 802 of FIG. 9, and thus will not again be described in detail. The inverter 1002 includes a PMOS transistor 1110 coupled between a supply voltage VCC and the input of the inverter 1104. When the PDN-DR<3> bit is inactive to disable the inverter 1002, the PMOS transistor 1110 turns on driving the input of the inverter 1104 high which, in turn, drives the PDN<3> bit low. The HIGH terminal of the inverter 1002 is coupled to the resistor network 741 of FIG. 7, and the value of the resistor network determines the rate at which the inverter drives the PDN<3> bit to its desired value, and thus, controls the slew rate of the inverter 1002.

Figure 12:
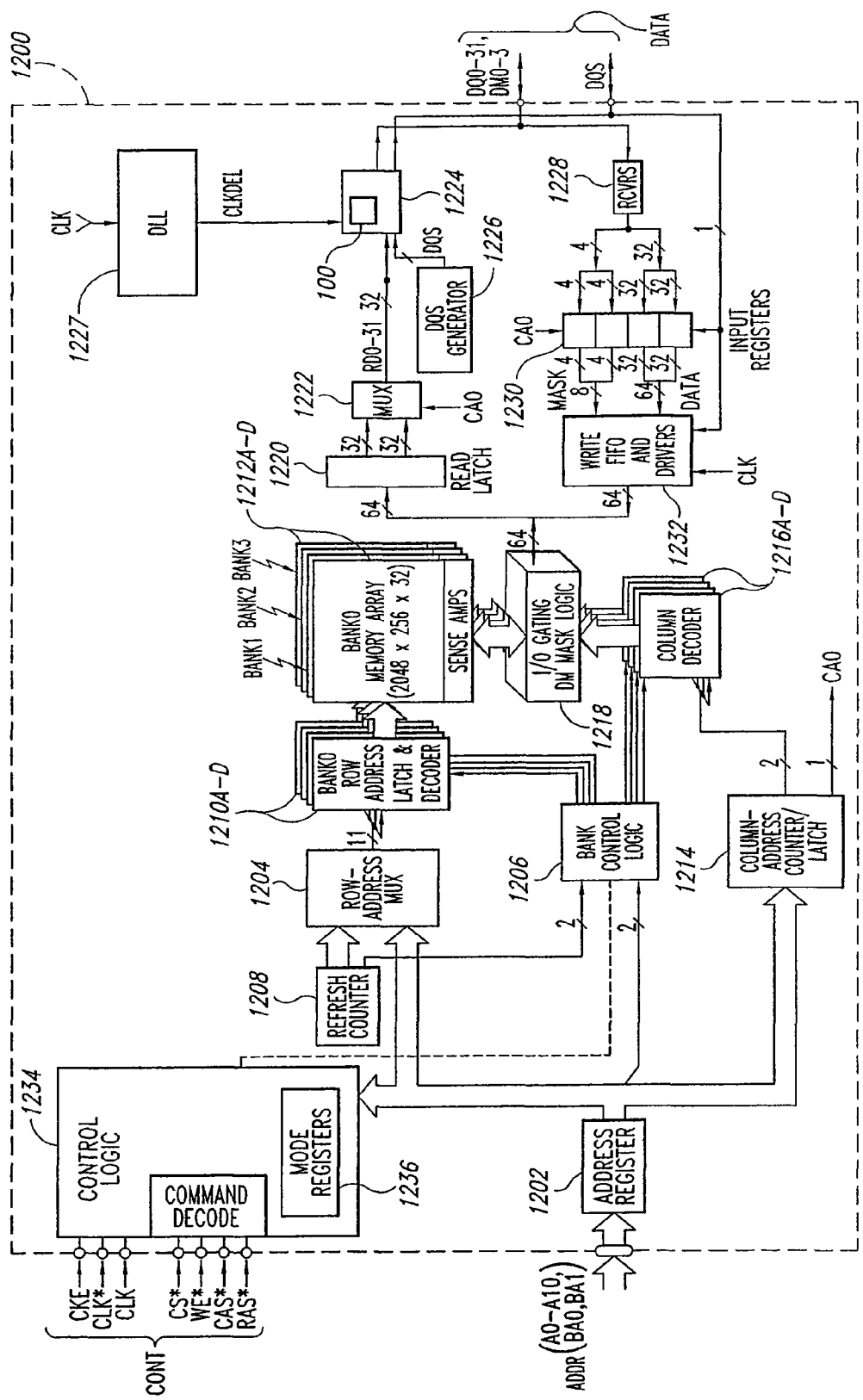
FIG. 12 is a functional block diagram of a memory device including the off chip driver impedance adjustment circuit of FIG. 1.

FIG. 12 is a functional block diagram of a memory device 1200 including the (OCD) impedance adjustment circuit 100 of FIG. 1. The memory device 1200 in FIG. 12 is a double-data rate (DDR) synchronous dynamic random access memory ("SDRAM"), although the principles described herein are particularly applicable to DDR II DRAM or any other integrated circuit that may include OCD impedance adjustment.

The memory device 1200 includes an address register 1202 that receives row, column, and bank addresses over an address bus ADDR, with a memory controller (not shown) typically supplying the addresses. The address register 1202 receives a row address and a bank address that are applied to a row address multiplexer 1204 and bank control logic circuit 1206, respectively. The row address multiplexer 1204 applies either the row address received from the address register 1202 or a refresh row address from a refresh counter 1208 to a plurality of row address latch and decoders 1210A-D. The bank control logic 1206 activates the row address latch and decoder 1210A-D corresponding to either the bank address received from the address register 1202 or a refresh bank address from the refresh counter 1208, and the activated row address latch and decoder latches and decodes the received row address. In response to the decoded row address, the activated row address latch and decoder 1210A-D applies various signals to a corresponding memory bank 1212A-D to thereby activate a row of memory cells corresponding to the decoded row address. Each memory bank 1212A-D includes a memory-cell array having a plurality of memory cells arranged in rows and columns, and the data stored in the memory cells in the activated row is stored in sense amplifiers in the corresponding memory bank. The row address multiplexer 1204 applies the refresh row address from the refresh counter 1208 to the decoders 1210A-D and the bank control logic circuit 1206 uses the refresh bank address from the refresh counter when the memory device 1200 operates in an auto-refresh or self-refresh mode of operation in response to an auto- or self-refresh command being applied to the memory device 1200, as will be appreciated by those skilled in the art.

A column address is applied on the ADDR bus after the row and bank addresses, and the address register 1202 applies the column address to a column address counter and latch 1214 which, in turn, latches the column address and applies the latched column address to a plurality of column decoders 1216A-D. The bank control logic 1206 activates the column decoder 1216A-D corresponding to the received bank address, and the activated column decoder decodes the applied column address. Depending on the operating mode of the memory device 1200, the column address counter and latch 1214 either directly applies the latched column address to the decoders 1216A-D, or applies a sequence of column addresses to the decoders starting at the column address provided by the address register 1202. In response to the column address from the counter and latch 1214, the activated column decoder 1216A-D applies decode and control signals to an I/O gating and data masking circuit 1218 which, in turn, accesses memory cells corresponding to the decoded column address in the activated row of memory cells in the memory bank 1212A-D being accessed.

During data read operations, data being read from the addressed memory cells is coupled through the I/O gating and data masking circuit 1218 to a read latch 1220. The I/O gating and data masking circuit 1218 supplies N bits of data to the read latch 1220, which then applies two N/2 bit words to a multiplexer 1222. In the embodiment of FIG. 3, the circuit 1218 provides 64 bits to the read latch 1220 which, in turn, provides two 32 bits words to the multiplexer 1222. A data driver 1224 sequentially receives the N/2 bit words from the multiplexer 1222 and also receives a data strobe signal DQS from a strobe signal generator 1226 and a delayed clock signal CLKDEL from a delay-locked loop (DLL) 1227. The DQS signal is used by an external circuit such as a memory controller (not shown) in latching data from the memory device 1200 during read operations. In response to the delayed clock signal CLKDEL, the data driver 1224 sequentially outputs the received N/2 bits words as a corresponding data word DQ, each data word being output in synchronism with a rising or falling edge of a CLK signal that is applied to clock the memory device 1200. The data driver 1224 also outputs the data strobe signal DQS having rising and falling edges in synchronism with rising and falling edges of the CLK signal, respectively. Each data word DQ and the data strobe signal DQS collectively define a data bus DATA. As will be appreciated by those skilled in the art, the CLKDEL signal from the DLL 1227 is a delayed version of the CLK signal, and the DLL 1227 adjusts the delay of the CLKDEL signal relative to the CLK signal to ensure that the DQS signal and the DQ words are placed on the DATA bus in synchronism with the CLK signal. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM0-X on the data bus DATA. A data receiver 1228 receives each DQ word and the associated DM0-X signals, and applies these signals to input registers 1230 that are clocked by the DQS signal. In response to a rising edge of the DQS signal, the input registers 1230 latch a first N/2 bit DQ word and the associated DM0-X signals, and in response to a falling edge of the DQS signal the input registers latch the second N/2 bit DQ word and associated DM0-X signals. The input register 1230 provides the two latched N/2 bit DQ words as an N-bit word to a write FIFO and driver 1232, which clocks the applied DQ word and DM0-X signals into the write FIFO and driver in response to the DQS signal. The DQ word is clocked out of the write FIFO and driver 1232 in response to the CLK signal, and is applied to the I/O gating and masking circuit 1218. The I/O gating and masking circuit 1218 transfers the DQ word to the addressed memory cells in the accessed bank 1212A-D subject to the DM0-X signals, which may be used to selectively mask bits or groups of bits in the DQ words (i.e., in the write data) being written to the addressed memory cells.

A control logic and command decoder 1234 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 1234 latches and decodes an applied command, and generates a sequence of clocking and control signals that control the components 1202-1232 to execute the function of the applied command. The clock enable signal CKE enables clocking of the command decoder 1234 by the clock signals CLK, CLK*. The command decoder 1234 latches command and address signals at positive edges of the CLK, CLK* signals (i.e., the crossing point of CLK going high and CLK* going low), while the input registers 1230 and data drivers 1224 transfer data into and from, respectively, the memory device 1200 in response to both edges of the data strobe signal DQS and thus at double the frequency of the clock signals CLK, CLK*. This is true because the DQS signal has the same frequency as the CLK, CLK* signals. The memory device 1200 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 1234 in generating the control and timing signals is conventional, and thus, for the sake of brevity, will not be described in more detail.

The control logic and command decoder 1234 would typically supply the external signals discussed with reference to the OCD impedance adjustment circuit 100 of FIG. 1, and the OCD impedance adjustment circuit 100 would typically be included with the data drivers 1224 previously discussed. The mode registers 1236 include the extended mode register 116 of FIG. 1 and the memory arrays 1212A-D correspond to the memory-cell array 120 of FIG. 1.

Figure 13:
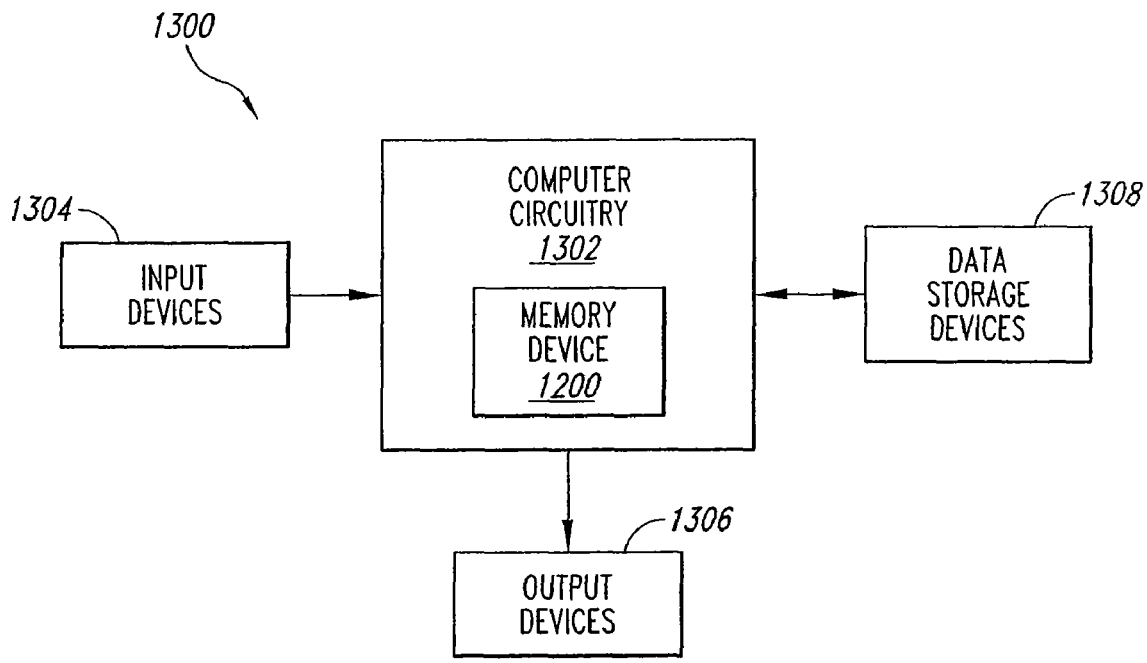
FIG. 13 is a functional block diagram of the computer system including the memory device of FIG. 12.

FIG. 13 is a block diagram of a computer system 1300 including computer circuitry 1302 including the memory device 1200 of FIG. 12. Typically, the computer circuitry 1302 is coupled through address, data, and control buses to the memory device 1200 to provide for writing data to and reading data from the memory device. The computer circuitry 1302 includes circuitry for performing various computing functions, such as executing specific software to perform specific calculations or tasks. In addition, the computer system 1300 includes one or more input devices 1304, such as a keyboard or a mouse, coupled to the computer circuitry 1302 to allow an operator to interface with the computer system. Typically, the computer system 1300 also includes one or more output devices 1306 coupled to the computer circuitry 1302, such as output devices typically including a printer and a video terminal. One or more data storage devices 1308 are also typically coupled to the computer circuitry 1302 to store data or retrieve data from external storage media (not shown). Examples of typical storage devices 1308 include hard and floppy disks, tape cassettes, compact disk read-only (CD-ROMs) and compact disk read-write (CD-RW) memories, and digital video disks (DVDs).

It is to be understood that even though various embodiments and advantages of the present invention have been set forth in the foregoing description, the above disclosure is illustrative only, and changes may be made in detail, and yet remain within the broad principles of the invention. For example, many of the components described above may be implemented using either digital or analog circuitry, or a combination of both, and also, where appropriate, may be realized through software executing on suitable processing circuitry. Therefore, the present invention is to be limited only by the appended claims.

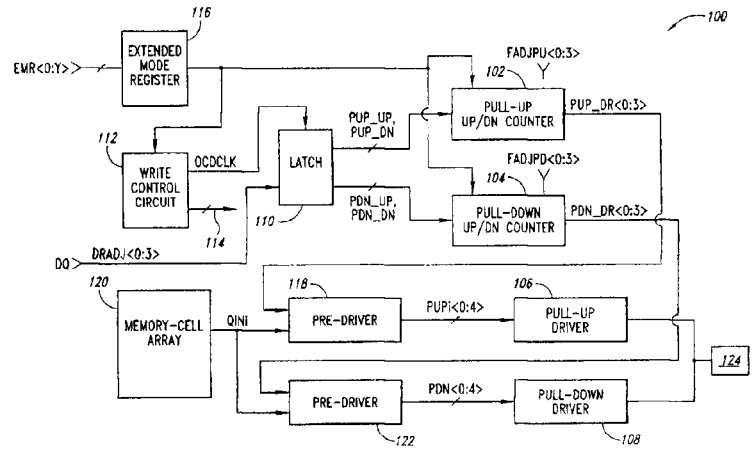

The invention claimed is:

1. A driver adjustment circuit, comprising:
   a counter circuit operable to receive a drive adjustment signal that comprises a four-bit word representing bits of data and configured to develop a drive adjustment count responsive to the drive adjustment signal, the counter circuit having a current value of a drive count set therein, wherein the counter circuit is set with a programmable value from a control circuit, the counter circuit comprising:
      a pull-up counter circuit configured to receive selected bits of the drive adjustment signal, and operable to develop a pull-up drive count responsive to the selected bits;
      a pull-down counter circuit configured to receive selected bits of the drive adjustment signal, and operable to develop a pull-down drive count responsive to the selected bits; and
      an output driver circuit coupled to the counter circuit configured to receive the drive adjustment count and being adapted to receive a data signal, the output driver circuit operable to develop an output signal responsive to the data signal and adjust a drive strength as a function of the drive adjustment count.

2. The driver adjustment circuit of claim 1 wherein the drive adjustment signal represents bits of data wherein the counter circuit is set with a programmable value from a control circuit.

3. The driver adjustment circuit of claim 1 wherein the counter circuit increments or decrements the current value of the drive count responsive to the drive adjustment signal to generate the drive adjustment count.

4. The driver adjustment circuit of claim 1 wherein the output driver circuit comprises:
   a first predriver circuit adapted to receive the data signal and the pull-up drive count from the pull-up counter circuit, the first predriver circuit operable to develop a pull-up drive signal responsive to the pull-up drive count and the data signal; and
   a second predriver circuit adapted to receive the data signal and the pull-down drive count from the pull-down counter circuit, the second predriver circuit operable to develop a pull-down drive signal responsive to the pull-down drive count and the data signal.

5. The driver adjustment circuit of claim 4 wherein the output driver circuit further comprises:
   a pull-up driver circuit coupled to the first predriver circuit to receive the pull-up drive signal and operable to adjust a pull-up drive strength of the output signal as a function of the pull-up drive signal when the output signal is to be driven high; and
   a pull-down driver circuit coupled to the second predriver circuit to receive the pull-down drive signal and operable to adjust a pull-down drive strength of the output signal as a function of the pull-down drive strength when the output signal is to be driven low.

6. The driver adjustment circuit of claim 5 wherein each of the pull-up and pull-down driver circuits comprises a plurality of transistors coupled between a voltage supply and an output node on which the output signal is developed, each transistor having a control terminal coupled to receive a respective bit of the corresponding drive signal.

7. The drive adjustment circuit of claim 4 wherein each of the first and second predriver circuits further includes a resistive network that controls a slew rate of bits forming the drive signal.

8. The driver adjustment circuit of claim 1 wherein the output driver circuit is further operable to adjust the drive strength as a function of drive mode bits.

9. The driver adjustment circuit of claim 7 wherein the drive mode bits include a half drive strength bit and a default drive strength signal.

10. A driver adjustment circuit, comprising:
    a counter circuit configured to develop a drive adjustment count responsive to a drive adjustment signal, the counter circuit comprising:
       a pull-up counter configured to develop a pull-up drive count responsive to a first drive adjustment signal that is operable to increment or decrement the pull-up counter;
       a pull-down counter configured to develop a pull-down drive count responsive to a second drive adjustment signal that is operable to increment or decrement the pull-down counter;
    a first output driver circuit coupled to receive the pull-up drive count from the pull-up counter and configured to adjust a drive strength toward a first voltage as a function of the pull-up drive count;
    a second output driver circuit coupled to receive the pull-down drive count from the pull-down counter and configured to adjust a drive strength toward a second voltage that is different from the first voltage as a function of the pull-down drive count;
    a storage device operable to store an initial pull-up count and an initial pull-down count; and
    circuitry coupled to the storage device and the counters and being configured to set the pull-up counter with the initial pull-up count and to set the pull-down counter with the initial pull-down count.

11. The driver adjustment circuit of claim 10 wherein the pull-up and pull-down counters are configured to be set with respective initial pull-up and pull-down counts prior to receiving the respective first and second drive adjustment signals.

12. The driver adjustment circuit of claim 10 wherein the first drive adjustment signal is different from the second drive adjustment signal.

13. The driver adjustment circuit of claim 10 wherein the first output driver circuit comprises a first predriver circuit adapted to receive the pull-up drive count from the pull-up counter circuit, the first predriver circuit operable to develop a pull-up drive signal responsive to the pull-up drive count, and wherein the second output driver circuit comprises a second predriver circuit adapted to receive the pull-down drive count from the pull-down counter circuit, the second predriver circuit operable to develop a pull-down drive signal responsive to the pull-down drive count.

14. The driver adjustment circuit of claim 10 wherein the pull-up driver circuit comprises a plurality of transistors coupled between the first voltage and an output node on which an output signal is developed, each transistor having a control terminal coupled to receive a respective bit of the corresponding pull-up drive count, and wherein the pull-down driver circuit comprises a plurality of transistors coupled between the second voltage and the output node, each transistor having a control terminal coupled to receive a respective bit of the corresponding pull-down drive count.

15. A method of adjusting a pull-up drive impedance and a pull-down drive impedance of an output driver that is operable in either a first mode or a second mode, the method comprising:
    setting first and second drive counts;
    adjusting the first and second drive counts as a function of at least one drive adjustment signal in the first mode;
    maintaining the first and second drive counts at respective preset values in the second mode;
    adjusting the pull-up drive impedance of the output driver as a function of the first drive count; and
    adjusting the pull-down drive impedance of the output driver as a function of the second drive count.

16. The method of claim 15 wherein the acts of setting the first and second drive counts comprises presetting the first and second drive counts to respective predetermined values.

17. The method of claim 15 wherein the act of adjusting the pull-up drive impedance of the output driver as a function of the first drive count comprises adjusting a first impedance between an output node and a first supply voltage source as a function of the first drive count, and wherein the act of adjusting the pull-down drive impedance of the output driver as a function of the second drive count comprises adjusting a second impedance between the output node and a second supply voltage source as a function of the second drive count.

18. The method of claim 15 wherein the act of adjusting the pull-up drive impedance of the output driver as a function of the first drive count comprises incrementing or decrementing a pre-existing value of the first drive count responsive a first drive adjustment signal, and the act of adjusting the pull-down drive impedance of the output driver as a function of the second drive count comprises incrementing or decrementing a pre-existing value of the second drive count responsive a second drive adjustment signal.

19. A driver adjustment circuit, comprising:
   a counter circuit operable to receive a drive adjustment signal that represents bits of data and configured to develop a drive adjustment count responsive to the drive adjustment signal, the counter circuit having a current value of a drive count set therein, the counter circuit comprising:
      a pull-up counter circuit configured to receive selected bits of the drive adjustment signal, and operable to develop a pull-up drive count responsive to the selected bits;
      a pull-down counter circuit configured to receive selected bits of the drive adjustment signal, and operable to develop a pull-down drive count responsive to the selected bits; and
   an output driver circuit coupled to the counter circuit configured to receive the drive adjustment count and being adapted to receive a data signal, the output driver circuit operable to develop an output signal responsive to the data signal and adjust a drive strength as a function of the drive adjustment count, the output driver circuit comprising:
      a first predriver circuit adapted to receive the data signal and the pull-up drive count from the pull-up counter circuit, the first predriver circuit operable to develop a pull-up drive signal responsive to the pull-up drive count and the data signal, the first predriver circuit including a resistive network that controls a slew rate of bits forming the pull-up drive signal; and
      a second predriver circuit adapted to receive the data signal and the pull-down drive count from the pull-down counter circuit, the second predriver circuit operable to develop a pull-down drive signal responsive to the pull-down drive count and the data signal, the second predriver circuit including a resistive network that controls a slew rate of bits forming the pull-down drive signal.

20. The driver adjustment circuit of claim 19 wherein the counter circuit increments or decrements the current value of the drive count responsive to the drive adjustment signal to generate the drive adjustment count.

21. The driver adjustment circuit of claim 19 wherein the output driver circuit further comprises:
   a pull-up driver circuit coupled to the first predriver circuit to receive the pull-up drive signal and operable to adjust a pull-up drive strength of the output signal as a function of the pull-up drive signal when the output signal is to be driven high; and
   a pull-down driver circuit coupled to the second predriver circuit to receive the pull-down drive signal and operable to adjust a pull-down drive strength of the output signal as a function of the pull-down drive strength when the output signal is to be driven low.

22. The driver adjustment circuit of claim 21 wherein each of the pull-up and pull-down driver circuits comprises a plurality of transistors coupled between a voltage supply and an output node on which the output signal is developed, each transistor having a control terminal coupled to receive a respective bit of the corresponding drive signal.

23. The driver adjustment circuit of claim 19 wherein the output driver circuit is further operable to adjust the drive strength as a function of drive mode bits.

24. A driver adjustment circuit, comprising:
   a counter circuit operable to receive a drive adjustment signal that represents bits of data and configured to develop a drive adjustment count responsive to the drive adjustment signal, the counter circuit having a current value of a drive count set therein, the counter circuit comprising:
      a pull-up counter circuit configured to receive selected bits of the drive adjustment signal, and operable to develop a pull-up drive count responsive to the selected bits;
      a pull-down counter circuit configured to receive selected bits of the drive adjustment signal, and operable to develop a pull-down drive count responsive to the selected bits; and
   an output driver circuit coupled to the counter circuit configured to receive the drive adjustment count and being adapted to receive a data signal, the output driver circuit operable to develop an output signal responsive to the data signal and adjust a drive strength as a function of the drive adjustment count, the output driver circuit further being operable to adjust the drive strength as a function of drive mode bits.

25. The driver adjustment circuit of claim 24 wherein the drive adjustment signal represents bits of data wherein the counter circuit is set with a programmable value from a control circuit.

26. The driver adjustment circuit of claim 24 wherein the counter circuit increments or decrements the current value of the drive count responsive to the drive adjustment signal to generate the drive adjustment count.

27. The driver adjustment circuit of claim 24 wherein the drive mode bits include a half drive strength bit and a default drive strength signal.

28. A driver adjustment circuit, comprising:
   a counter circuit operable to receive a drive adjustment signal that comprises a four-bit word representing bits of data and configured to develop a drive adjustment count responsive to the drive adjustment signal, the counter circuit having a current value of a drive count set therein, wherein the counter circuit is set with a programmable value from a control circuit, the counter circuit comprising:
   a pull-up counter circuit configured to receive selected bits of the drive adjustment signal, and operable to develop a pull-up drive count responsive to the selected bits;
   a pull-down counter circuit configured to receive selected bits of the drive adjustment signal, and operable to develop a pull-down drive count responsive to the selected bits; and
   an output driver circuit coupled to the counter circuit configured to receive the drive adjustment count and being adapted to receive a data signal, the output driver circuit operable to develop an output signal responsive to the data signal and adjust a drive strength as a function of the drive adjustment count, wherein the output driver circuit is further operable to adjust the drive strength as a function of drive mode bits.

* * * * *

UNITED STATES PATENT AND TRADEMARK OFFICE
CERTIFICATE OF CORRECTION

PATENT NO. : 7,936,181 B2
APPLICATION NO. : 12/329132
DATED : May 3, 2011
INVENTOR(S) : Greg A. Blodgett and Christopher K. Morzano It is certified that error appears in the above-identified patent and that said Letters Patent is hereby corrected as shown below:

In the Claims

Column 15, line 1, please delete in its entirety claim 2.
Column 15, line 46, "claim 7" should read --claim 8--.
Column 18, line 63, please add claim 29 as follows --29. The driver adjustment circuit of claim 28 wherein the drive mode bits include a half drive strength bit and a default drive strength signal--.

Signed and Sealed this
Twenty-first Day of May, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 7,936,181 B2
APPLICATION NO. : 12/329132
DATED : May 3, 2011
INVENTOR(S) : Greg A. Blodgett and Christopher K. Morzano Page 1 of 2

It is certified that error appears in the above-identified patent and that said Letters Patent is hereby corrected as shown below:

Title Page

Delete the title page and substitute therefore the attached title page showing the corrected number of claims in the patent.

In the Claims

Column 15, line 1, please delete in its entirety claim 2.
Column 15, line 46, "claim 7" should read --claim 8--.
Column 18, line 63, please add claim 29 as follows --29. The driver adjustment circuit of claim 28 wherein the drive mode bits include a half drive strength bit and a default drive strength signal--.

This certificate supersedes the Certificate of Correction issued May 21, 2013.

Signed and Sealed this
Eleventh Day of June, 2013

Teresa Stanek Rea
*Acting Director of the United States Patent and Trademark Office*

(12) United States Patent
Blodgett et al.

(10) Patent No.: US 7,936,181 B2
(45) Date of Patent: *May 3, 2011

(54) METHOD AND CIRCUIT FOR OFF CHIP DRIVER CONTROL, AND MEMORY DEVICE USING SAME

(75) Inventors: Greg A. Blodgett, Nampa, ID (US); Christopher K. Morzano, Boise, ID (US)

(73) Assignee: Round Rock Research, LLC, Mt. Kisco, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 12/329,132

(22) Filed: Dec. 5, 2008

(65) Prior Publication Data
US 2009/0091350 A1 Apr. 9, 2009

Related U.S. Application Data

(63) Continuation of application No. 11/351,047, filed on Feb. 8, 2006, now Pat. No. 7,463,052, which is a continuation of application No. 10/726,312, filed on Dec. 1, 2003, now Pat. No. 7,019,553.

(51) Int. Cl.
*H03K 19/003* (2006.01)
(52) U.S. Cl. .......................... 326/30; 326/83
(58) Field of Classification Search ............ 326/30, 326/82, 83; 327/108, 109
See application file for complete search history.

(56) References Cited

U.S. PATENT DOCUMENTS

| | | | |
|---|---|---|---|
| 5,097,149 A | 3/1992 | Lee | 307/443 |
| 5,099,148 A | 3/1992 | McClure et al. | 307/443 |
| 5,128,560 A | 7/1992 | Chern et al. | 307/475 |
| 5,134,311 A | 7/1992 | Biber et al. | 307/270 |
| 5,274,276 A | 12/1993 | Casper et al. | 307/443 |
| 5,357,156 A | 10/1994 | Herrington | |
| 5,576,656 A | 11/1996 | McClure | 327/538 |
| 5,594,373 A | 1/1997 | McClure | 327/108 |
| 5,606,275 A | 2/1997 | Farhang et al. | 327/108 |
| 5,617,064 A | 4/1997 | Gorecki | 333/22 R |

(Continued)

FOREIGN PATENT DOCUMENTS

EP 0978943 A2 2/2000

(Continued)

OTHER PUBLICATIONS

Gabara, Thaddeus J., et al., "Digitally Adjustable Resistors in CMOS for High-Performance Applications," IEEE Journal of Solid-State Circuits, vol. 27, No. 8, Aug. 1992, pp. 1176-1185, cited by other.

(Continued)

*Primary Examiner* — James Cho
(74) *Attorney, Agent, or Firm* — Lerner, David, Littenberg, Krumholz & Mentlik, LLP

(57) ABSTRACT

An off chip driver impedance adjustment circuit includes a storage circuit adapted to receive and store a drive strength adjustment word. A counter circuit is coupled to the storage circuit to receive the drive strength adjustment word and develops a drive strength count responsive to the drive strength adjustment word. A programmable fuse code to preset the counter. An output driver circuit is coupled to the counter circuit to receive the drive strength count and is adapted to receive a data signal. The output driver circuit develops an output signal on an output responsive to the data signal and adjusts a drive strength as a function of the drive strength count.

29 Claims, 10 Drawing Sheets